(12) United States Patent
Cho et al.

(10) Patent No.: US 7,833,813 B2
(45) Date of Patent: Nov. 16, 2010

(54) THIN FILM TRANSISTOR ARRAY PANEL AND METHOD OF MANUFACTURING THE SAME

(75) Inventors: Neung-Ho Cho, Gyeonggi-do (KR); Sung-Wook Kim, Gyeonggi-do (KR); Yong-Kil Park, Gyeonggi-do (KR); Bae-Hyoun Jung, Gyeonggi-do (KR); Dong-Yub Chae, Seoul (KR); Youn-Soo Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1337 days.

(21) Appl. No.: 11/336,031

(22) Filed: Jan. 20, 2006

(65) Prior Publication Data

US 2006/0160260 A1 Jul. 20, 2006

(30) Foreign Application Priority Data

Jan. 20, 2005 (KR) .................. 10-2005-0005305

(51) Int. Cl.
*H01L 21/78* (2006.01)

(52) U.S. Cl. .................. 438/48; 257/E33.053

(58) Field of Classification Search .......... 438/128, 438/48, 149, 688; 257/72, 59, E33.053
See application file for complete search history.

(56) References Cited

U.S. PATENT DOCUMENTS

2002/0074549 A1* 6/2002 Park et al. ............. 257/59
2002/0149018 A1* 10/2002 Hirata .................. 257/72
2003/0201439 A1* 10/2003 Yamazaki et al. ........ 257/59
2004/0114071 A1 6/2004 Rho
2004/0173797 A1 9/2004 Kim
2004/0201560 A1 10/2004 Shen et al.
2004/0218123 A1 11/2004 Park et al.

FOREIGN PATENT DOCUMENTS

| JP | 2003-195329 | 7/2003 |
| JP | 2003-222854 | 8/2003 |
| JP | 2003-248232 | 9/2003 |
| JP | 2004-240091 | 8/2004 |
| KR | 1020010009014 | 2/2001 |
| KR | 100309925 | 9/2001 |
| KR | 1020030050273 | 6/2003 |
| KR | 1020040010877 | 2/2004 |
| KR | 100451659 | 9/2004 |

* cited by examiner

*Primary Examiner*—Nathan W Ha
(74) *Attorney, Agent, or Firm*—Innovation Counsel LLP

(57) ABSTRACT

The present invention provides a method of manufacturing a TFT array panel in a cost-effective manner. The method includes: forming thin film transistors each having a gate electrode, a source electrode, and a drain electrode; forming an insulating layer on the thin film transistors; forming a first conductive layer electrically connected to the drain electrodes on the insulating layer; forming a second conductive layer on the first conductive layer; forming a photoresist layer including first portions and second portions thinner than the first portions; selectively etching the second conductive layer with a first etchant by using the photoresist layer as an etch blocker; and selectively etching the first conductive layer with a second etchant by using the photoresist layer and the second conductive layer as etch blockers.

19 Claims, 17 Drawing Sheets

THIN FILM TRANSISTOR ARRAY PANEL AND METHOD OF MANUFACTURING THE SAME

CROSS-REFERENCE TO RELATED APPLICATION

This patent application claims priority from Korean Patent Application No. 10-2005-0005305 filed on Jan. 20, 2005, the content of which is incorporated by reference herein in its entirety.

BACKGROUND OF THE INVENTION (a) Field of the Invention

The present description relates to a thin film transistor (TFT) array panel and a manufacturing method. More specifically, the present description relates to a thin film transistor (TFT) array panel for a liquid crystal display (LCD) and its manufacturing method.

(b) Description of the Related Art

Liquid Crystal Displays (LCDs) are one of the most widely used types of flat panel displays today. An LCD includes a liquid crystal (LC) layer interposed between two panels provided with field-generating electrodes. An LCD displays images by applying voltages to the field-generating electrodes to generate an electric field in the LC layer that determines orientations of LC molecules in the LC layer to adjust the polarization of incident light. Once the polarization is adjusted, the light is either intercepted by or transmitted through a polarizing film, thereby displaying a desired image.

LCDs are classified into a transmissive LCD, a reflective LCD, and a transflective LCD according to what is used as the light source. The transmissive LCD typically uses a backlight as a light source. The reflective LCD uses external light from the environment as a light source. The transflective LCD is capable of using both a backlight and external light as a light source depending on the circumstances.

For manufacturing a transflective LCD, seven photo-etching processes are required. The seven photo-etching processes include formation of gate lines, a semiconductor layer, data lines, an embossed surface and contact holes of an organic insulating layer, contact holes of a passivation layer, transmission electrodes, and reflection electrode. Due to the required number of steps, manufacturing cost and time are higher compared to those of a transparent LCD using four or five photo-etching processes. A more efficient method of manufacturing transflective LCDs is desired.

SUMMARY OF THE INVENTION

The present invention provides a manufacturing method for a TFT array panel requiring less photo-etchings steps than the conventional processes.

In one aspect, the present invention provides a method of manufacturing a TFT array panel efficiently. The method includes forming a plurality of thin film transistors each having a gate electrode, a source electrode, and a drain electrode; forming an insulating layer on the thin film transistors; forming a first conductive layer electrically connected to the drain electrodes on the insulating layer; forming a second conductive layer on the first conductive layer; forming a photoresist layer including first portions and second portions thinner than the first portions; selectively etching the second conductive layer with a first etchant by using the photoresist layer as an etch blocker; and selectively etching the first conductive layer with a second etchant by using the photoresist layer and the second conductive layer as etch blockers.

The method may also include etching the photoresist layer to remove the second portions and to expose the second conductive layer after the selective etching of the first conductive layer; and selectively etching the exposed portions of the second conductive layer with the first etchant by using the first portions of the photoresist layer as an etch blocker.

The first conductive layer may contain ITO. The ITO may be in an amorphous state.

The second etchant may contains sulfuric acid, a combination of hydrochloric acid and a surfactant, or a combination of oxalic acid and a surfactant.

The second conductive layer may contain Al or Al alloy.

The first etchant may contains phosphoric acid, nitric acid, and acetic acid.

The formation of the first conductive layer may be performed at a temperature between 25° C. and 150° C.

The formation of the first conductive layer may be performed in an atmosphere of hydrogen gas ($H_2$) or water vapor ($H_2O$).

In another aspect, the method of manufacturing a TFT array panel according to the invention includes: forming a gate line; forming a semiconductor, a data line and a drain electrode on the gate line; forming a passivation layer and an organic insulating layer on the data line and the drain electrode; sequentially depositing an amorphous ITO layer and a first conductive layer on the organic insulating layer; forming a photoresist layer including first portions and second portions thinner than the first portions on the first conductive layer; selectively etching the first conductive layer with a first etchant by using the photoresist layer as an etch blocker; and selectively etching the amorphous ITO layer with a second etchant by using the photoresist layer and the first conductive layer as etch blockers; etching the photoresist layer to remove the second portions and to expose the first conductive layer; and selectively etching the exposed portions of the first conductive layer with the first etchant by using the first portions of the photoresist layer as an etch blocker.

In yet another aspect, the present invention provides a TFT array panel including a substrate; a gate line formed on the substrate; a data line formed on the gate line; an insulating layer formed on the data line; a transmission electrode formed on the insulating layer; and a reflection electrode formed on the transmission electrode and having an edge substantially coinciding with at least an edge of the transmission electrode.

The reflection electrode may have an opening.

In yet another aspect, the present invention provides a TFT array panel that includes: a substrate; a gate line formed on the substrate; a data line formed on the gate line; an insulating layer formed on the data line; a transmission electrode formed on the insulating layer; and a reflection electrode formed on the transmission electrode and including a first edge that has substantially uniform distance from a first edge of the transmission electrode.

The transmission electrode may have an edge disposed outside of the boundary of the reflection electrode.

The uniform distance may be substantially the same as or larger than the thickness of the reflection electrode.

The reflection electrode may include a second edge that has a substantially uniform distance from a second edge of the transmission electrode and the distance between the first edge of the reflection electrode and the first edge of the transmission electrode may be substantially the same as the distance between the second edge of the reflection electrode and the second edge of the transmission electrode.

BRIEF DESCRIPTION OF THE DRAWINGS

Preferred embodiments of the present invention can be understood in more detail from the following descriptions taken in conjunction with the accompanying drawings, in which.

DETAILED DESCRIPTION OF THE PREFERRED EMBODIMENTS

Figure 1:
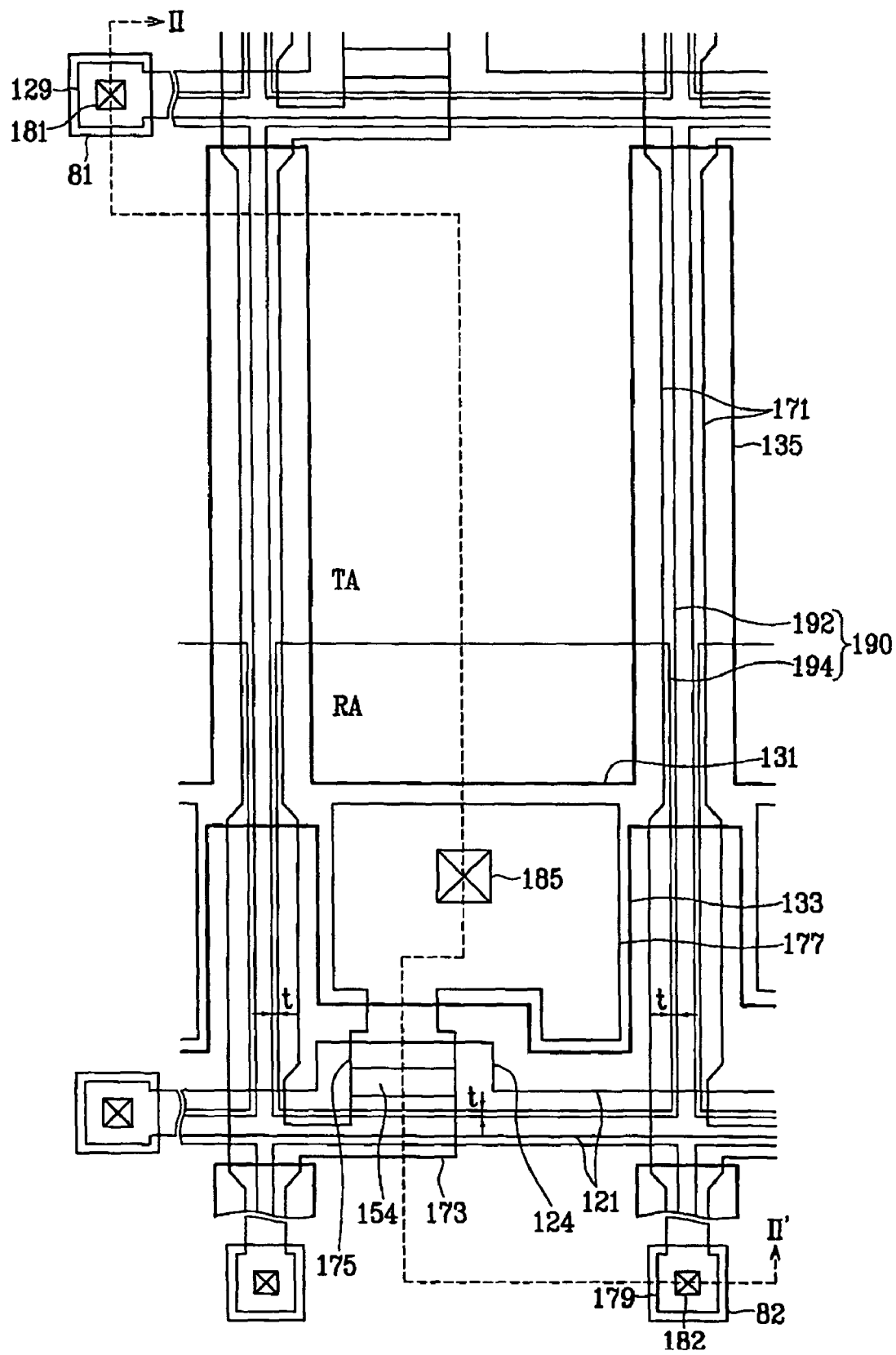
FIG. 1 is a layout view of a TFT array panel according to an embodiment of the present invention.

Preferred embodiments of the present invention will now be described more fully hereinafter with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Now, TFT array panels and manufacturing methods thereof according to embodiments of this invention will be described in detail with reference to the accompanying drawings for a person of ordinary skill in the art to make and use the invention.

Figure 2:
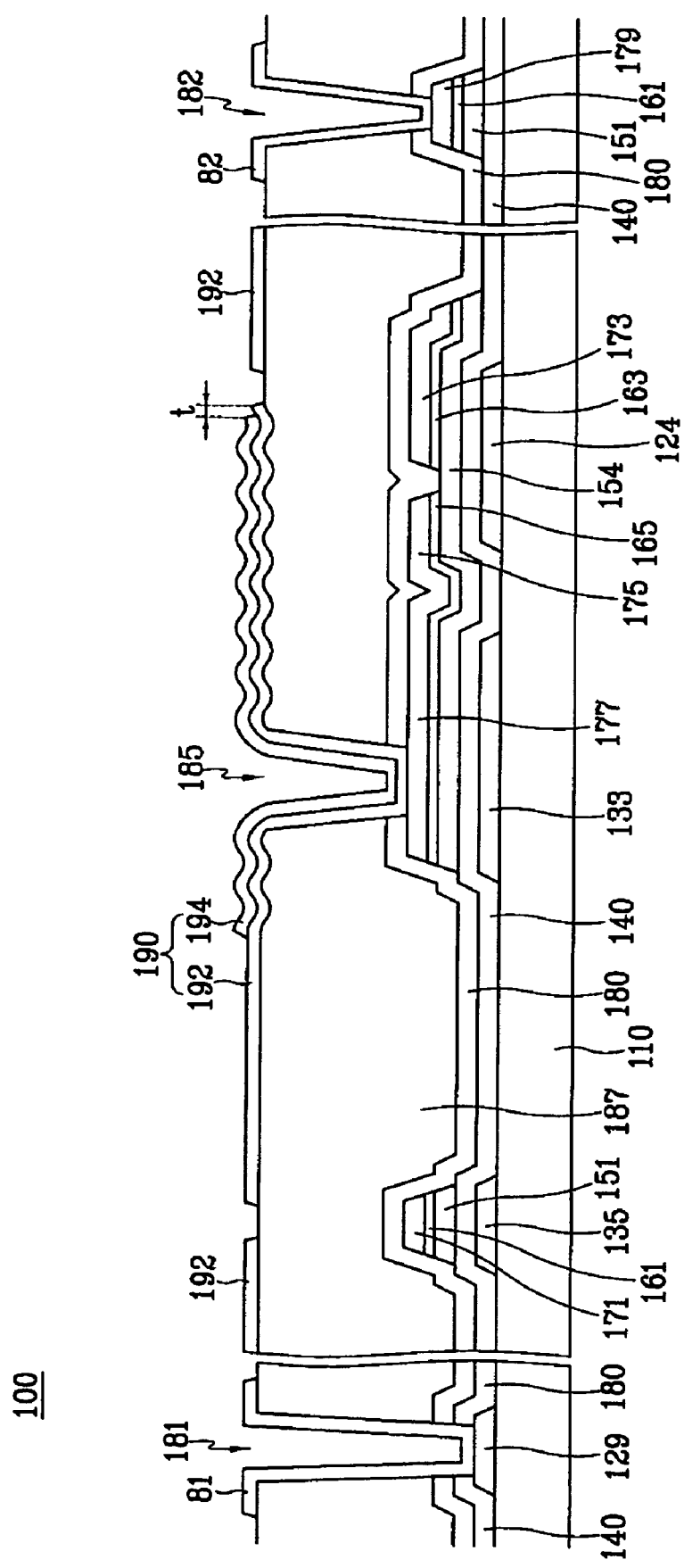
FIG. 2 is a sectional view taken along the line II-II' of FIG. 1.

FIG. 1 is a layout view of a TFT array panel according to an embodiment of the present invention. FIG. 2 is a sectional view taken along the line II-II' of FIG. 1.

Referring to FIGS. 1 and 2, a TFT array panel 100 will be described.

A plurality of gate lines 121 for transmitting gate signals and storage electrode lines 131 are formed on an insulating substrate 110.

Each gate line 121 includes a plurality of portions projecting upward (with respect to FIG. 1) to form a plurality of gate electrodes 124 and an expansion 129 having a large area for contact with another layer or an external device.

The storage electrode lines 131 are mainly formed in the first direction (the horizontal direction with respect to FIG. 1) and having a plurality of protrusions forming storage electrodes 133 and light blocking members 135. The storage electrode lines 131 are applied with a predetermined voltage such as a common voltage that is applied to a common electrode (not shown) of the common electrode panel (not shown). The light blocking members 135 block the light from the back light (not shown) disposed at a lower side of the TFT array panel 100.

The gate lines 121 and the storage electrode line 131 are preferably made of one of an Al-based metal such as pure Al and an Al alloy, an Ag-based metal such as pure Ag and an Ag alloy, a Cu-based metal such as Cu and a Cu alloy, a Mo-based metal such as Mo and a Mo alloy, Cr, Ti, and Ta. The gate lines 121 and the storage electrode lines 131 may include two films having different physical characteristics, a lower film and an upper film. The upper film is preferably made of a low-resistivity metal including an Al-containing metal such as Al and Al alloy for reducing signal delay or voltage drop in the gate lines 121 and the storage electrode lines 131. On the other hand, the lower film is preferably made of a material such as Cr, Mo, and Mo alloy such as MoW, which has good physical, chemical, and electrical contact characteristics with other materials such as indium tin oxide (ITO) and indium zinc oxide (IZO). An exemplary combination of the lower film material and the upper film material is Cr and Al—Nd alloy. The gate lines 121 and the storage electrode lines 131 may have multiple layers, e.g. equal to or more than three.

The lateral sides of the gate lines 121 and the storage electrode lines 131 are inclined relative to a surface of the substrate 110 to form an inclination angle of about 30-80 degrees.

A gate insulating layer 140 made of an insulating material such as SiNx is formed on the gate lines 121 and the storage electrode lines 131.

A plurality of semiconductor stripes 151 preferably made of hydrogenated amorphous silicon (abbreviated to "a-Si") are formed on the gate insulating layer 140. Each semiconductor stripe 151 extends substantially in the second direction (i.e., the longitudinal direction with respect to FIG. 1) and has a plurality of projections 154 branching out toward the gate electrodes 124.

A plurality of ohmic contact stripes 161 and islands 165 preferably made of silicide or n+ hydrogenated a-Si heavily doped with n-type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductors 151 and the ohmic contacts 161 and 165 are inclined relative to a surface of the substrate 110 to form inclination angles of about 30-80 degrees.

A plurality of data lines 171 and a plurality of drain electrodes 175 are formed on the ohmic contacts 161 and 165 and the gate insulating layer 140.

The data lines 171 for transmitting data voltages extend substantially in the second direction and intersect the gate lines 121. Each data line 171 includes an expansion 179 having a larger area for contact with another layer or an external device.

The light blocking members 135 overlap the data lines 171.

A plurality of branches of each data line 171, which extend toward the drain electrodes 175, form a plurality of source electrodes 173. Each pair of the source electrodes 173 and the drain electrodes 175 are separated from each other and located across a gate electrode 124 from each other. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 are preferably made of a material having strong resistance against chemicals, such as Cr, Mo based metal, Ta, and Ti. The data lines 171 and the drain electrodes 175 may have a multi-layered structure including a lower film made of Mo, a Mo alloy, or Cr and an upper film located thereon and made of an Al-containing metal or an Ag-containing metal.

Like the gate lines 121 and the storage electrode lines 131, the data lines 171 and the drain electrodes 175 have tapered lateral sides relative to the surface of the substrate 110. The tapered sides form inclination angles of about 30-80 degrees with respect to the substrate 110.

The ohmic contacts 161 and 165 are interposed only between the underlying semiconductors 151 and 154 and the overlying data lines 171 and drain electrodes 175 and reduce the contact resistance therebetween. The planar pattern of the ohmic contacts 161 and 165 is substantially the same as that of the data lines 171 and drain electrodes 175. The semiconductor stripes 151 include a plurality of exposed portions, which are not covered with the data lines 171 and the drain electrodes 175, such as portions located between the source electrodes 173 and the drain electrodes 175.

A passivation layer 180 is formed on the data lines 171, the drain electrodes 175, and exposed portions of the semiconductor stripes 151, which are not covered with the data lines 171 and the drain electrodes 175. The passivation layer 180 is preferably made of an inorganic insulating material such as SiNx or $SiO_2$. An organic insulating layer 187 is formed on the passivation layer 180. The organic insulating layer 187 is formed from a photosensitive organic material having good planarization characteristics. Here, organic insulating layer 187 has an embossed surface.

The organic insulating layer 187 and the passivation layer 180 have contact holes 182 exposing the expansions 179 of the data lines 171 and contact holes 185 exposing the drain electrodes 175. The organic insulating layer 187, the passivation layer 180 and the gate insulting layer 140 have contact holes 181 exposing the expansions 129 of the gate lines 121. The contact holes 181, 182, and 185 may have any of various shapes such as polygonal or circular shape and may have sidewalls that are inclined relative to a surface of the substrate 110. The sidewalls of the contact holes 181, 182, 185 form inclination angles of about 30-85 degrees with respect to the substrate 110. In some embodiments, the contact holes 181, 182, and 185 may have stepped sidewalls.

A plurality of pixel electrodes 190 are formed on the organic insulating layer 187.

Each pixel electrode 190 includes a transmission electrode 192 and a reflection electrode 194 formed thereon. The transmission electrode 192 is made of a transparent conductive material such as ITO and the reflection electrode 194 is made of a metal having high reflectance, such as Al, an Al alloy, Ag, or an Al alloy. The reflection electrode 194 has an embossed surface due to the embossed surface of the organic insulating layer 187. The embossed surface enhances the reflective characteristics of the reflection electrode 194.

When the transmission electrode 192 is made of ITO, the ITO may be amorphous or polycrystalline. The transmission electrode 192 may be made of a conductive polymer.

The pixel electrode 190 may further include a contact assistant layer (not illustrated) made of Mo, a Mo alloy, Cr, Ti, or Ta. The contact assistant layer enhances contact characteristics between the transmission electrode 192 and the reflection electrode 194, thereby preventing the reflection electrode 194 from being corroded due to the transmission electrode 192.

A pixel has a transmission region TA and a reflection region RA. The transmission region TA is a region where the reflection electrode 194 is not disposed and the reflection region RA is a region where the reflection electrode 194 is disposed. Referring to FIG. 1, each reflection region RA has a rectangular shape and each transmission region TA includes three stripe portions having a narrow width (t) and the transmission region TA surrounds the reflection region RA. The width (t) of the stripe portions in the transmission region TA is substantially uniform in three sides of the reflection region RA. Since the width (t) of the stripe portions are narrow, the edges of the transmission electrode 192 and the reflection electrode 194 substantially coincide along the three sides.

The pixel electrodes 190 are physically and electrically connected to the drain electrodes 175 through the contact holes 185 such that the pixel electrodes 190 receive the data voltages from the drain electrodes 175.

The pixel electrodes 190 supplied with the data voltages generate electric fields in cooperation with a common electrode (not illustrated). The electric fields reorient liquid crystal molecules in the liquid crystal layer (not illustrated) disposed therebetween.

The pixel electrode 190 and the common electrode form a liquid crystal capacitor, which stores applied voltages after the TFT turns off. An additional capacitor called a "storage capacitor" is connected in parallel to the liquid crystal capacitor. The storage capacitors are implemented by overlapping of the drain electrodes 175 and pixel electrode 190 and the storage electrode lines 131. The storage capacitors may be implemented by overlapping of the pixel electrodes 190 and previous gate lines 121. In this case, the storage electrode lines 131 may be omitted.

The pixel electrodes 190 overlap the gate lines 121 and the data lines 171 to increase the aperture ratio but it is optional.

The contact assistants 81 and 82 are connected to the exposed expansions 129 of the gate lines 121 and the exposed expansions 179 of the data lines 171 through the contact holes 181 and 182, respectively. The contact assistants 81 and 82 protect the expansions 129 and 179 and complement the adhesion between the expansions 129, 179 and external devices. The contact assistants 81 and 82 are not essential components and may be formed of the same material as one of the transmission electrode 192 or the reflection electrode 194.

A method of manufacturing a TFT array panel will now be described in detail with reference to FIGS. 3 to 12 as well as FIGS. 1 and 2.

Figure 3:
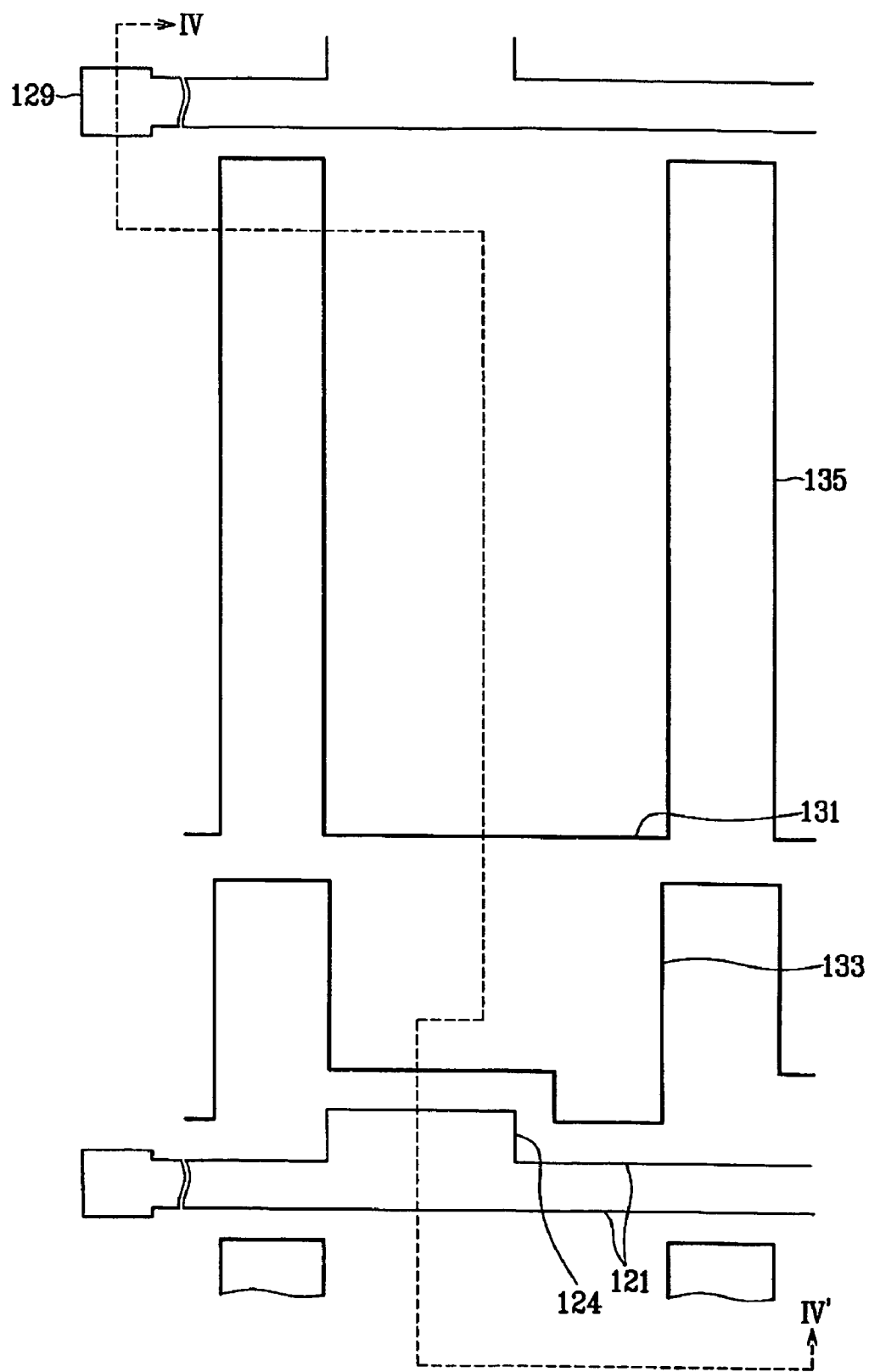
FIGS. 3, 7, and 9 are layout views sequentially illustrating the intermediate steps of a method of manufacturing a TFT array panel according to an embodiment of the present invention.
Figure 4:
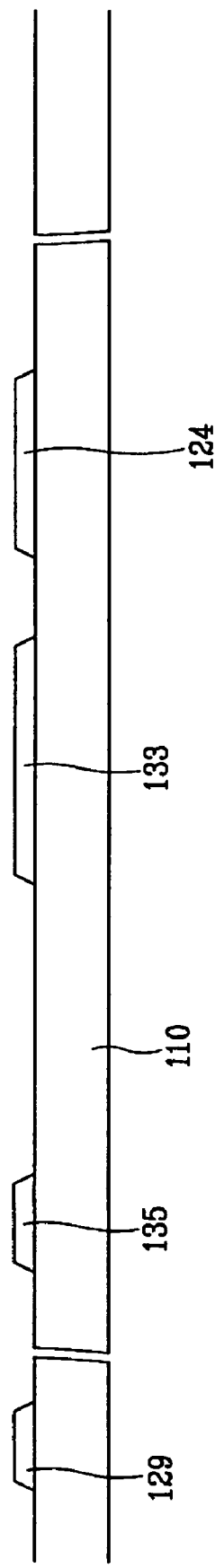
FIGS. 4, 8, and 10 are sectional views of the TFT array panel respectively shown in FIGS. 3, 7, and 9 taken along the lines IV-IV', VIII-VIII', and X-X'.
Figure 5:
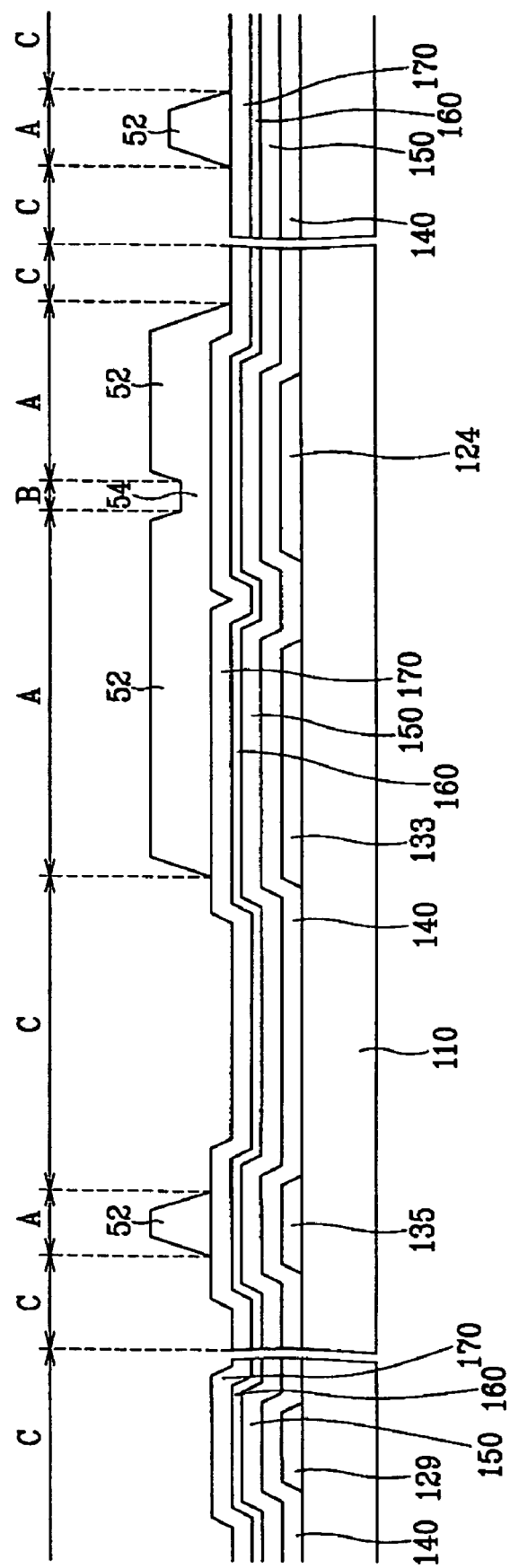
FIGS. 5 and 6 are sectional views of the TFT array panel illustrating the steps following the step of FIG. 4.
Figure 6:
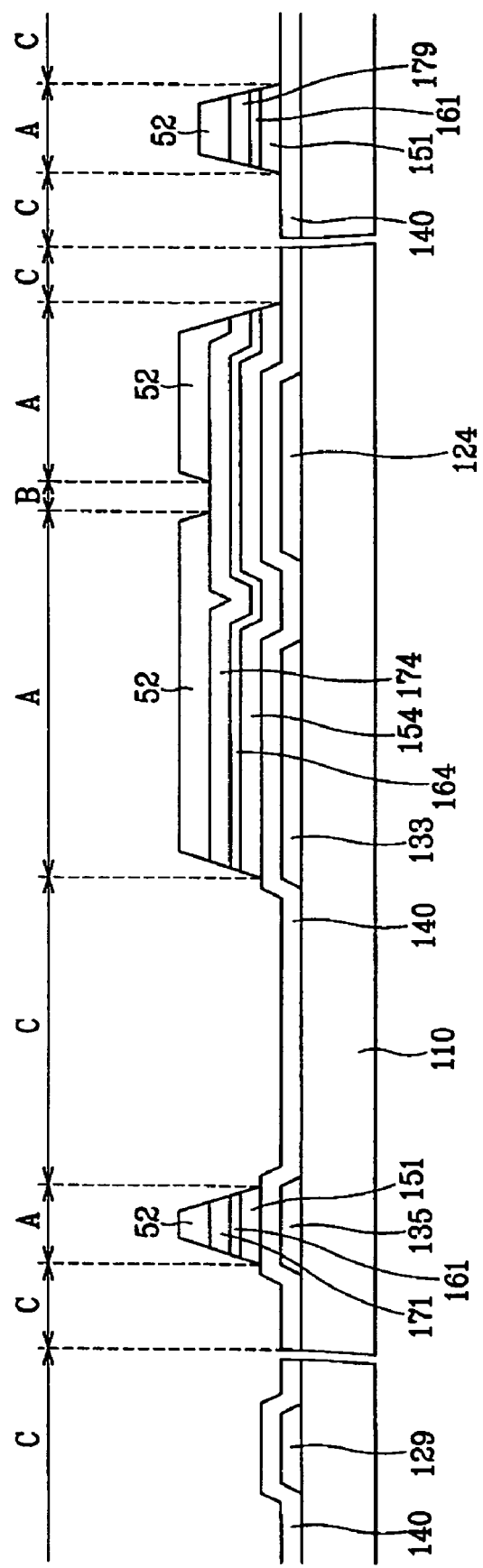
Figure 7:
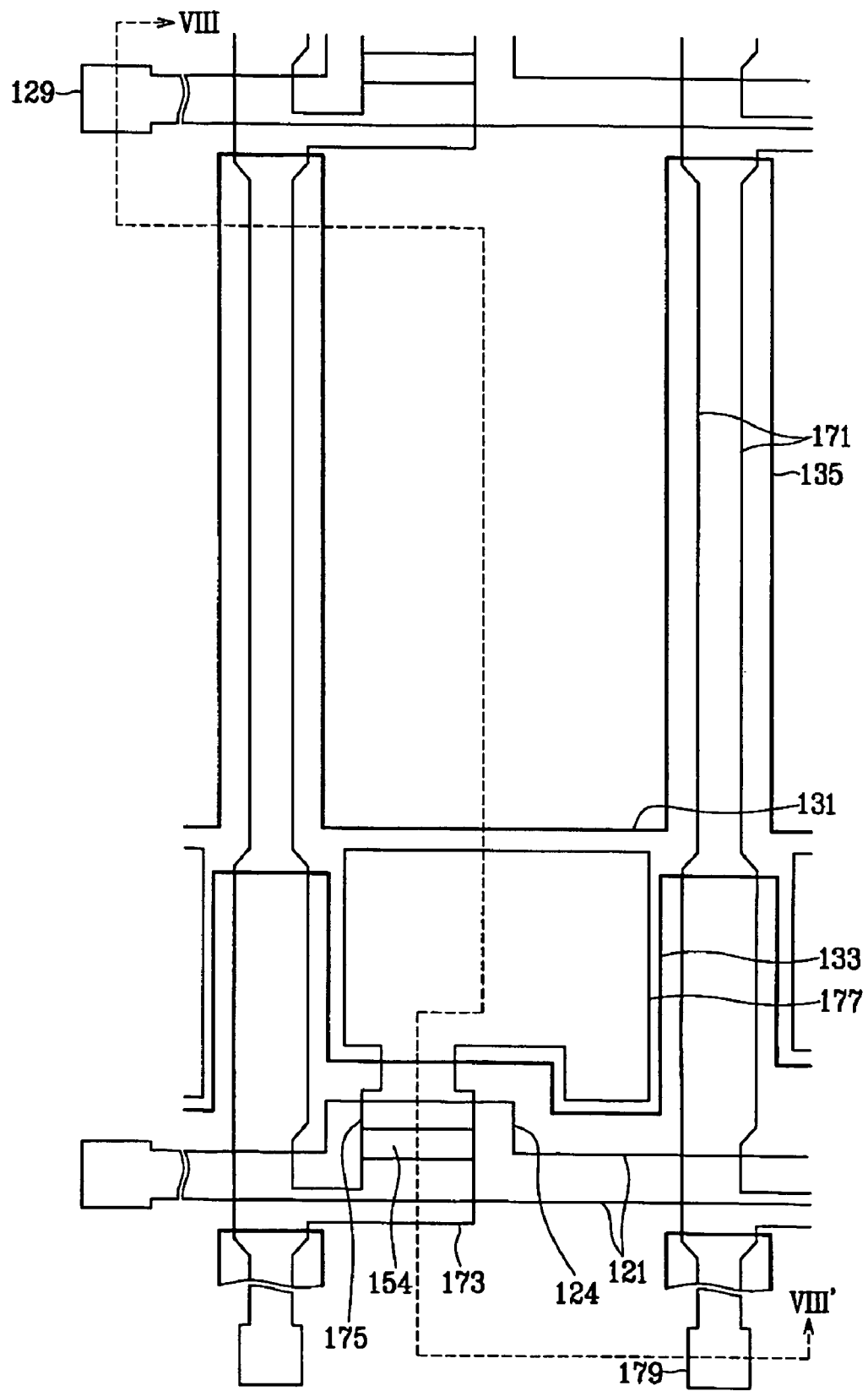
Figure 8:
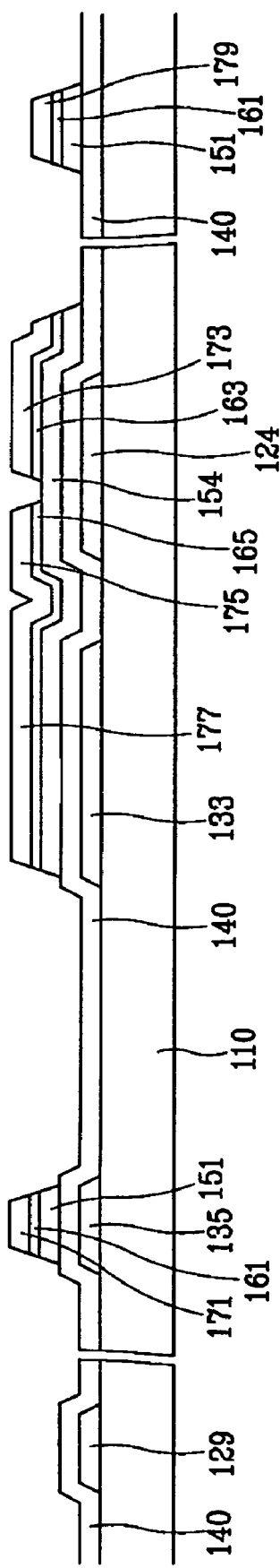
Figure 9:
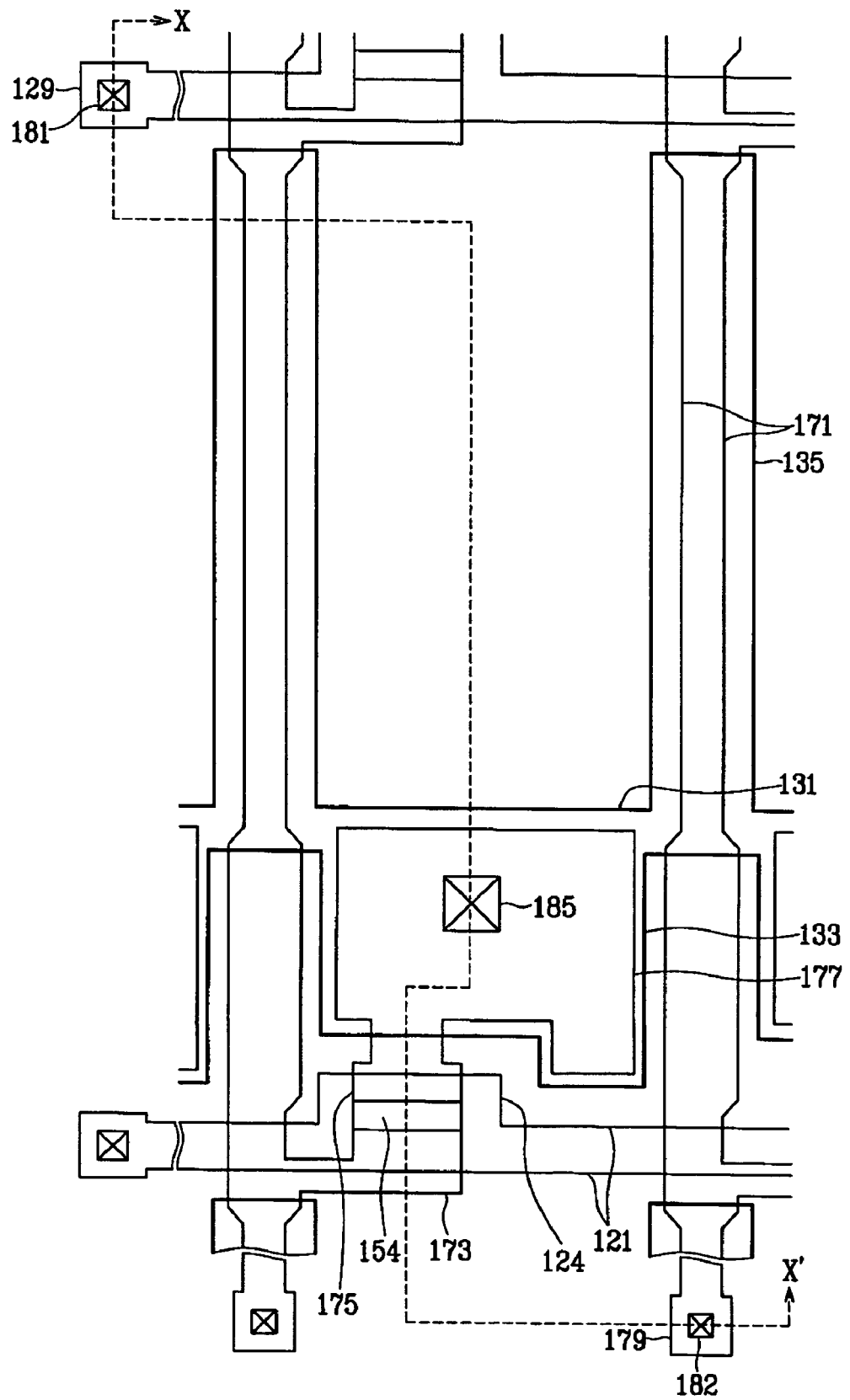
Figure 10:
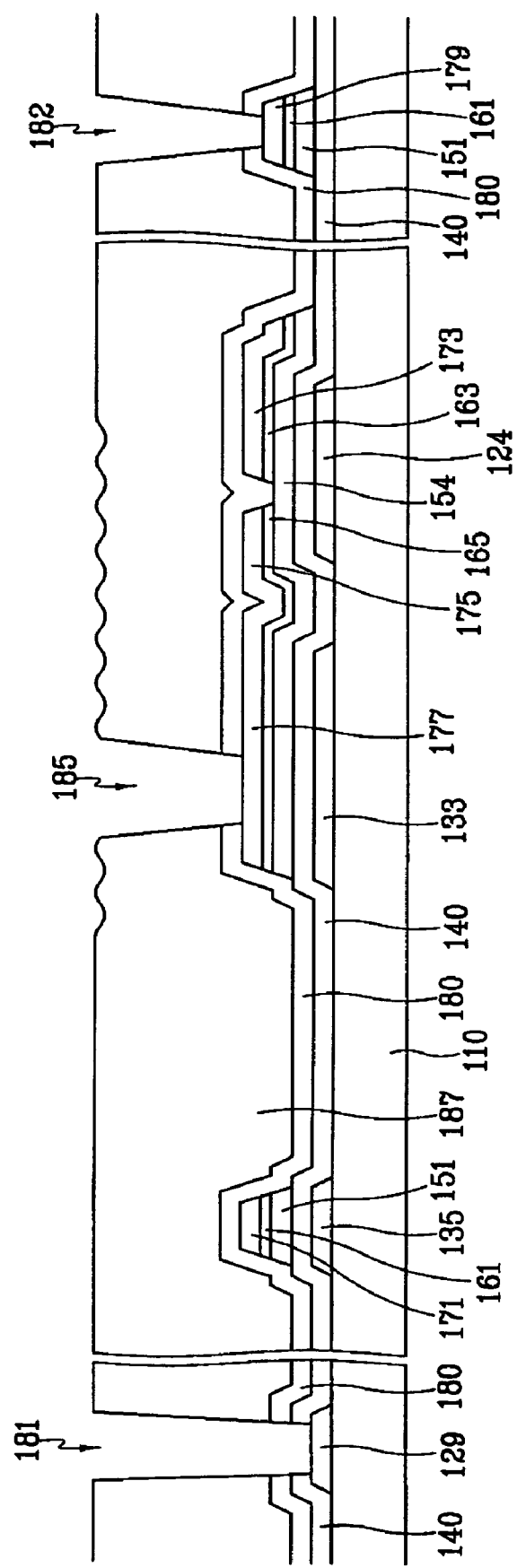
Figure 11:
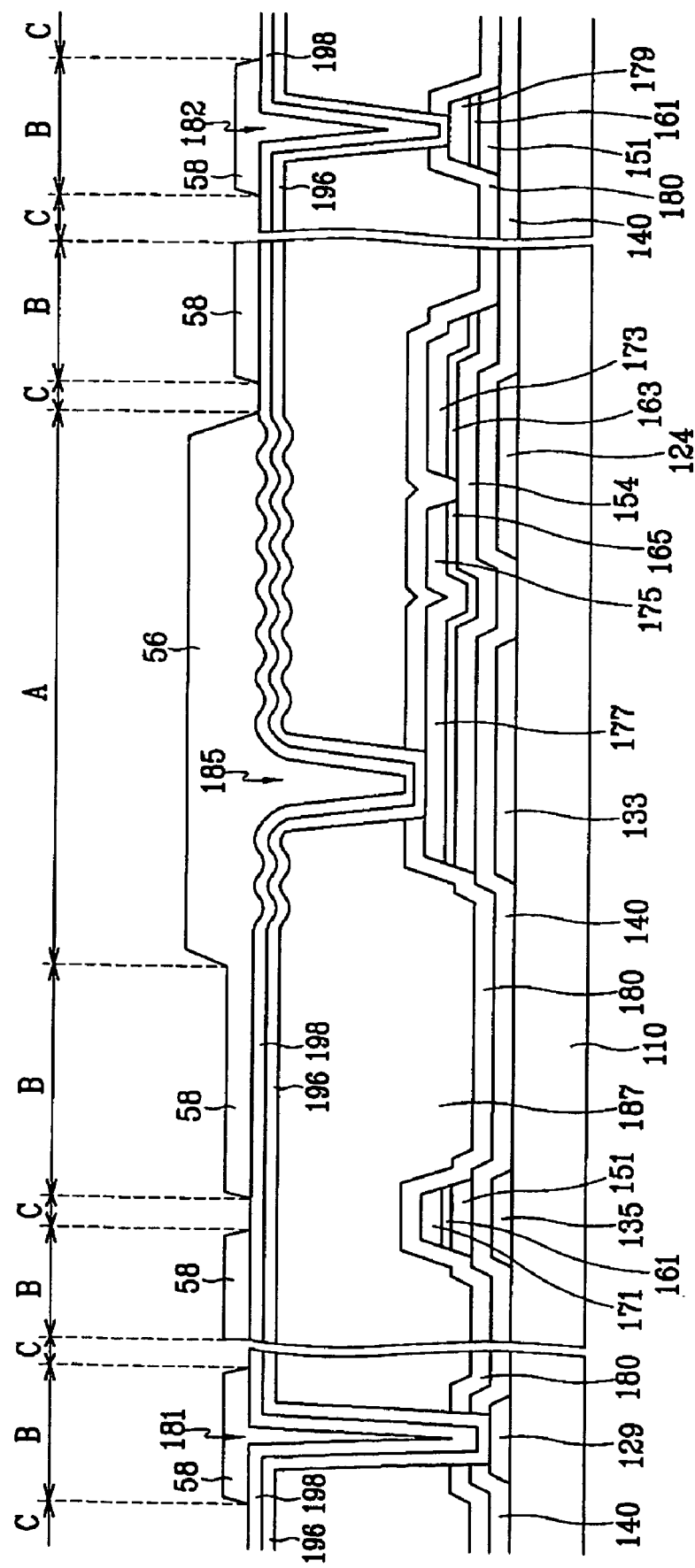
FIGS. 11 and 12 are sectional views of the TFT array panel illustrating the steps following the step of FIG. 10.
Figure 12:
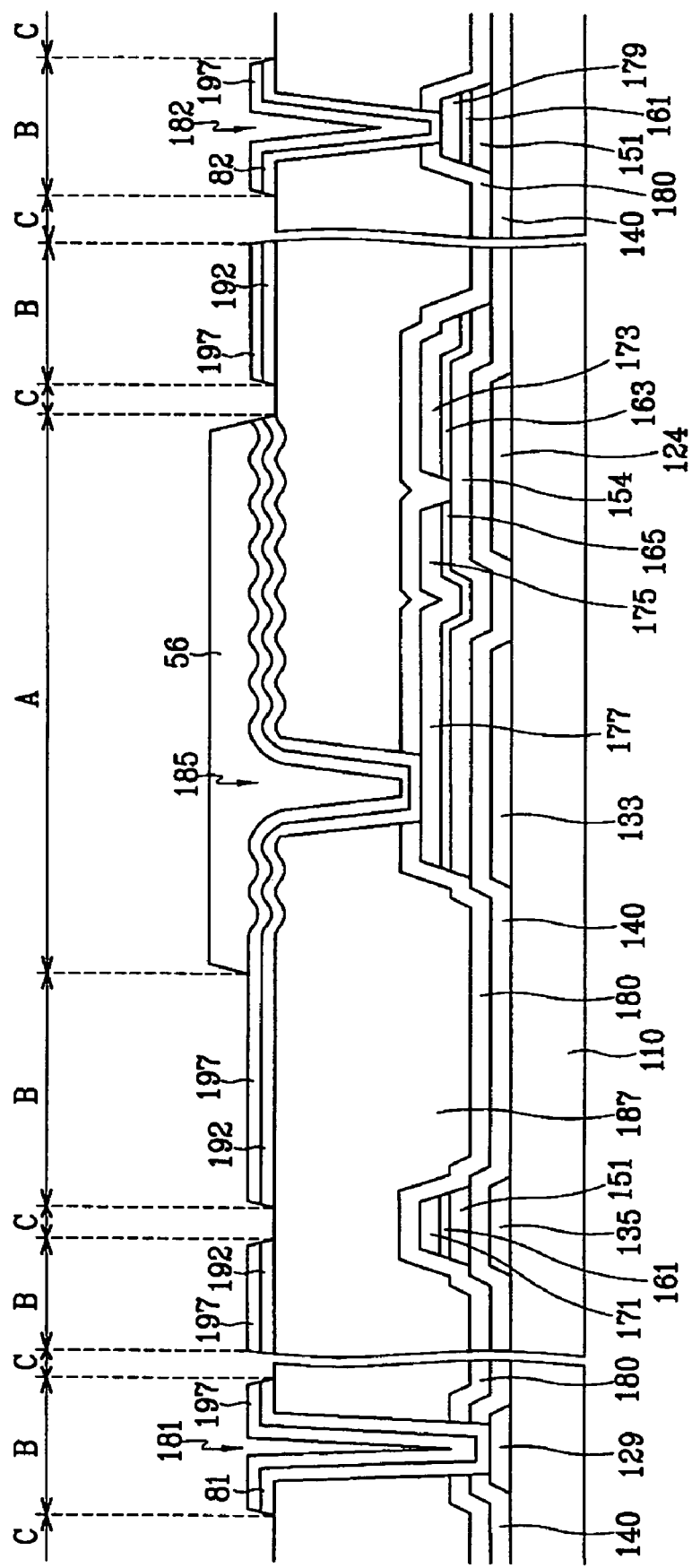

FIGS. 3, 7, and 9 are layout views sequentially illustrating the intermediate steps of a method of manufacturing a TFT array panel according to an embodiment of the present invention. FIGS. 4, 8, and 10 are sectional views of the TFT array panel respectively shown in FIGS. 3, 7, and 9 taken along the lines IV-IV', VIII-VIII', and X-X'. FIGS. 5 and 6 are sectional views of the TFT array panel illustrating the steps that follow the step of FIG. 4. FIGS. 11 and 12 are sectional views of the TFT array panel illustrating the steps following the step of FIG. 10.

Referring to FIGS. 3 and 4, a conductive layer made of one of an Al-based metal such as pure Al and an Al alloy, an Ag-based metal such as pure Ag and an Ag alloy, a Cu-based metal such as Cu and a Cu alloy, a Mo-based metal such as Mo and a Mo alloy, Cr, Ti, and Ta is deposited on an insulating substrate 110 made of a transparent material such as glass by a deposition method such as sputtering.

The conductive layer is photo-etched by using a mask to form gate lines 121 having gate electrodes 124 and expansions 129 and storage electrode lines 131 having storage electrodes 133 and light blocking members 135.

Next, referring to FIGS. 5 and 6, a gate insulating layer 140, an intrinsic amorphous silicon layer 150, and an extrinsic amorphous silicon layer 160 are sequentially deposited by a deposition method such as chemical vapor deposition.

A conductive layer 170 made of a material having strong resistance against chemicals, such as Cr, Mo-based metal, Ta, and Ti is deposited on the extrinsic amorphous silicon layer 160 by a deposition method such as sputtering.

Then, a photoresist layer (not illustrated) is coated on the conductive layer 170 and a photo mask (not illustrated) is disposed on the photoresist layer.

The photo mask has translucent regions B as well as transparent regions C and light blocking opaque regions A. The translucent areas may have a slit pattern, a lattice pattern, a thin film(s) with intermediate transmittance or intermediate thickness.

The photoresist layer is exposed to light through the photo mask and developed such that the developed photoresist has a position-dependent thickness as shown in FIG. 5. The developed photoresist includes a plurality of first portions 52 and second portions 54 which are thinner than the first portion 52.

Next, the conductive layer 170 is etched by using the photoresist 52 and 54 as an etch blocker to form conductive patterns 174 and data lines 171 including expansions 179. Then, the extrinsic amorphous silicon layer 160 and the intrinsic amorphous silicon layer 150 are etched to form extrinsic semiconductors 161 and 164 and intrinsic semiconductors 151 and 154, which have substantially the same planar pattern as the conductive patterns 174 and data lines 171.

Next, referring to FIG. 6, the photoresist 52 and 54 are etched to remove the second portions 54, thereby exposing portions of the conductor patterns 174.

Referring to FIGS. 7 and 8, the exposed portions of the conductive patterns 174 are etched to complete the source electrodes 173 and drain electrodes 175.

Extrinsic semiconductors 164 are dry-etched to form ohmic contacts 163 and 165.

Referring to FIGS. 9 and 10, a passivation layer 180 of silicon nitride is deposited by chemical vapor deposition (CVD) and an organic insulating layer 187 is coated on the passivation layer 180.

Next, the organic insulating layer 187 is exposed to light through a photo mask having a predetermined pattern such as slits and is developed to form an embossed structure on the surface of the organic insulating layer 187 and contact holes 181, 182, and 185, exposing some portions of the passivation layer 180.

Then, the passivation layer 180 is etched by using the organic insulating layer 187 as an etch blocker to complete the contact holes 182 and 185 and the passivation layer 180 and gate insulating layer 140 are etched by using the organic insulating layer 187 as an etch blocker to complete the contact hole 181.

Referring to FIGS. 11 and 12, an ITO layer 196 and a conductive layer 198 made of a metal such as Al, Al alloy, Ag, and Ag alloy are sequentially deposited by a deposition method such as sputtering. Here, the ITO layer 196 is deposited at a temperature of about 25° C. to about 150° C. and in an atmosphere of hydrogen gas ($H_2$) or water vapor ($H_2O$) to have amorphous state.

Then, a photoresist layer (not illustrated) is coated on the conductive layer 198 and a photo mask (not illustrated) is aligned on the photoresist layer.

The photo mask has translucent regions B as well as transparent regions C and light blocking opaque regions A. The translucent regions B may have a slit pattern, a lattice pattern, a thin film(s) with intermediate transmittance or intermediate thickness.

The photoresist layer is exposed to light through the photo mask and developed such that the developed photoresist has a position-dependent thickness as shown in FIG. 11. The developed photoresist includes a plurality of third and fourth portions 56 and 58. The third portions 56 are disposed under the light blocking opaque regions A and the fourth portions 58 are disposed under the translucent regions B. No photoresist remains under the transmission region C.

Next, the conductive layer 198 is wet-etched by using the photoresist 56 and 58 as an etch blocker. Here, the etchant contains phosphoric acid ($H_3PO_4$), nitric acid ($HNO_3$), acetic acid ($CH_3COOH$), and deionized water. The etchant is preferably an Al etchant that contains 63 to 70 wt. % phosphoric acid ($H_3PO_4$), 4 to 8 wt. % nitric acid ($HNO_3$), and 12 to 19 wt. % acetic acid ($CH_3COOH$), with the remaining quantity being deionized water.

The Al etchant etches the conductive layer 198 but does not etch the ITO layer 196. Accordingly, the ITO layer 196 does not get damaged from the Al etchant while the conductive layer 198 is etched.

The ITO layer 196 is wet-etched by using the photoresist 56 and 58 and the conductive layer 197 as an etch blocker. Here, an IZO (indium zinc oxide) etchant is applied. The IZO etchant may be one of 1) a sulfuric acid ($H_2SO_4$)-containing etchant which preferably contains 2-15 wt. % sulfuric acid and 1-15 wt. % potassium sulfate ($KHSO_4$) with deionized water making up the residual quantity, 2) an etchant containing hydrochloric acid (HCl) and a surfactant which preferably contains 3-25 wt. % hydrochloric acid, 1-10 wt. % nitric acid, and a surfactant, with deionized water making up the residual quantity, or 3) an etchant containing oxalic acid ($C_2H_2O_4$) and a surfactant which preferably contains 5-15 wt. % oxalic acid and a surfactant, with deionized water making up the residual quantity.

Amorphous ITO is etched by the IZO etchant, which is a distinguishing feature of amorphous ITO from polycrystalline ITO. The IZO etchant does not etch the conductive layer 197. Accordingly, the ITO layer 196 in amorphous state is etched without damaging the conductive layer 197.

Through the described processes, pixel electrodes 192 and 197 are separated from each other and contact assistants 81 and 82 with conductive layer 197 are formed.

Next, photoresist portions 56 and 58 are etched to remove the fourth portions 58, thereby forming the portions of the conductive layer 197 disposed on the transmission regions TA and pad regions. The etching reduces the thickness of the third portions 56.

Next, exposed portions of the conductive layer 197 are wet etched to expose transmission electrodes 192 and contact assistants 81 and 82, thereby completing the transmission region TA and pad portions. An Al etchant is applied as an etchant.

Since the edges of the conductive layers 197 are also exposed, the edges of the conductive layers 197 are etched by the Al etchant. The etched edges of the conductive layers 197 are recessed. The recessed width (t) is substantially uniform along three sides of the conductive layers 197 and is substantially the same as or larger than the thickness of the conductive layers 197.

Next, residual photoresist is removed to expose the reflection electrodes 194 on the reflection region RA.

As described above, the transmission electrodes 192 and the reflection electrodes 194 are formed together by using a photo mask and etchants that can selectively etch the amorphous ITO layer 196 and the conductive layer 198. Accordingly, manufacturing cost and time are reduced compared to the conventional method of using two separate photo masks to form the transmission electrodes 192 and the reflection electrodes 194. Furthermore, since the transmission electrodes 192 and the reflection electrodes 194 are sequentially deposited, undesirable lifting of the reflection electrodes 194 is prevented.

A TFT array panel according to another embodiment of the present invention will be described with reference to FIGS. 13 and 14.

Figure 13:
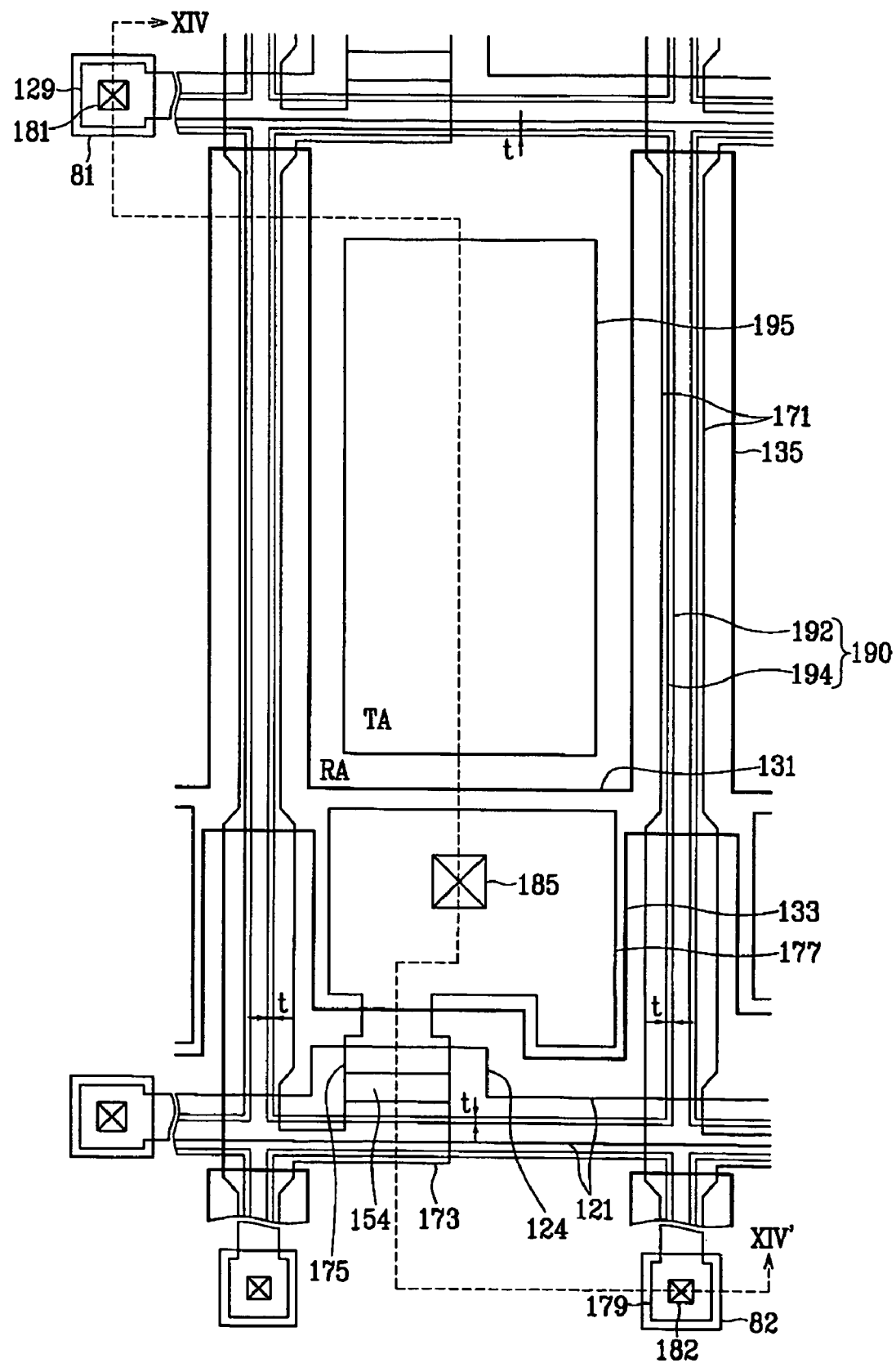
FIG. 13 is a layout view of a TFT array panel according to another embodiment of the present invention.

FIG. 13 is a layout view of a TFT array panel according to another embodiment of the present invention. FIG. 14 is a sectional view taken along the line XIV-XIV' of FIG. 13.

Figure 14:
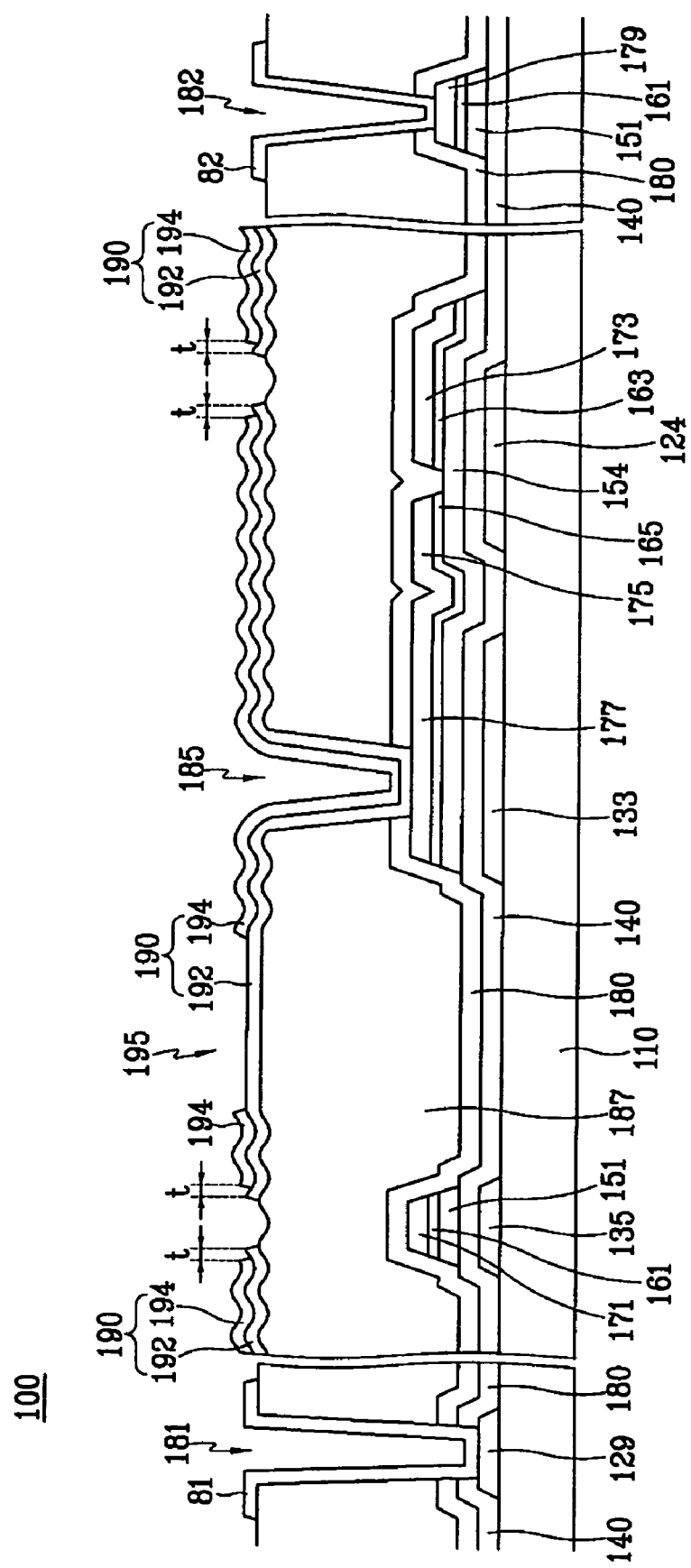
FIG. 14 is a sectional view taken along the line XIV-XIV' of FIG. 13.

The TFT array panel of FIGS. 13 and 14 has almost the same layered structure as that of the FIGS. 1 and 2.

That is, a plurality of gate lines 121 including the gate electrodes 124 are formed on an insulating substrate 110. A gate insulating layer 140, a plurality of semiconductors 151, ohmic contacts 161 and 165 are sequentially formed on the gate lines 121. A plurality of data lines 171 including source electrodes 173 and a plurality of drain electrodes 175 are formed on the ohmic contacts 161 and 165 and the gate insulating layer 140. A passivation layer 180 and an organic insulating layer 187 are formed on the data lines 171 and the drain electrodes 175.

The passivation layer 180, organic insulating layer 187, and/or gate insulating layer 140 have a plurality of contact holes 181, 182, and 185 and a plurality of pixel electrodes 190 including transmission electrodes 192 and reflection electrodes 194. The contact assistants 81 and 82 are formed on the organic insulating layer 187.

In the present embodiment, a transmission region TA is surrounded by a reflection region RA. This is a distinguishing feature of the present embodiment. That is, the reflection electrode 194 has an opening 195 exposing the transmission electrode 192. The transmission region TA includes four stripe portions having a narrow width (t) and surrounding the reflection electrode 194. The width (t) of the stripe portions of the transmission region TA is substantially uniform along the four sides of the reflection electrode 194.

Here, the transmission region TA is a region where the reflection electrode 194 is not disposed and the reflection region RA is a region where the reflection electrode 194 is disposed.

A method of manufacturing a TFT array panel will be now described in detail with reference to FIGS. 15 to 17 as well as FIGS. 3 to 8, 13, and 14.

Figure 15:
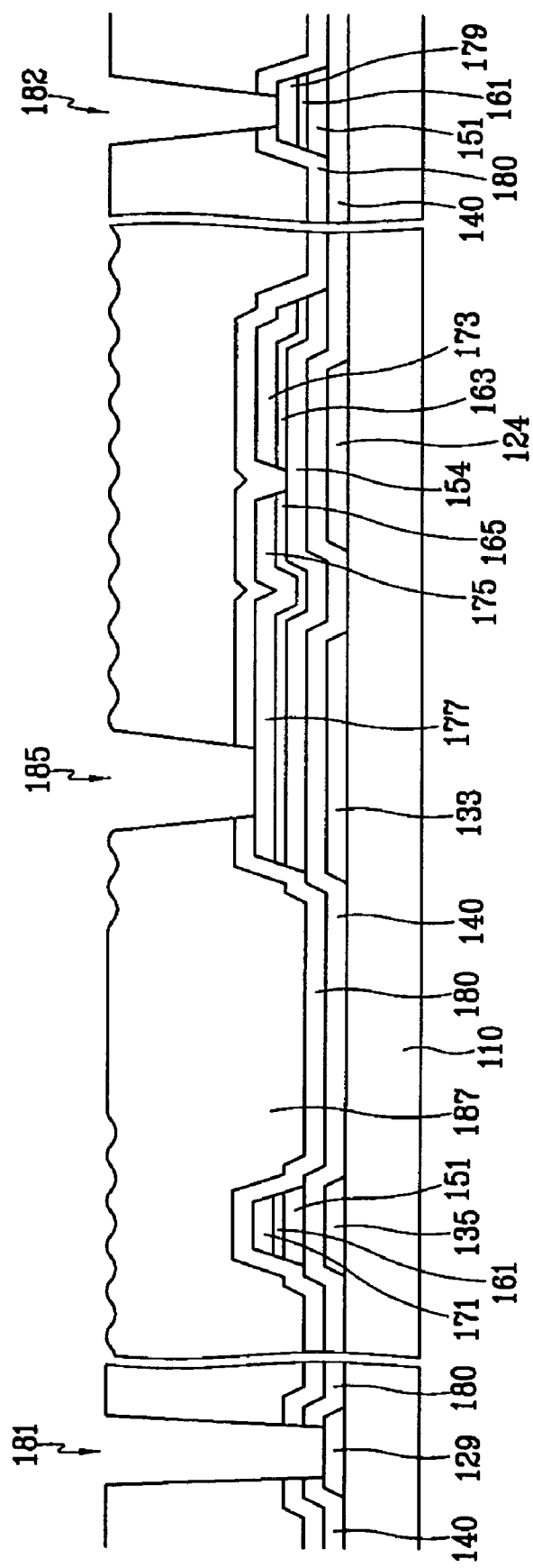
FIGS. 15 to 17 are sectional views sequentially illustrating the intermediate steps of a method of manufacturing a TFT array panel after the step of FIG. 8 according to another embodiment of the present invention.
Figure 16:
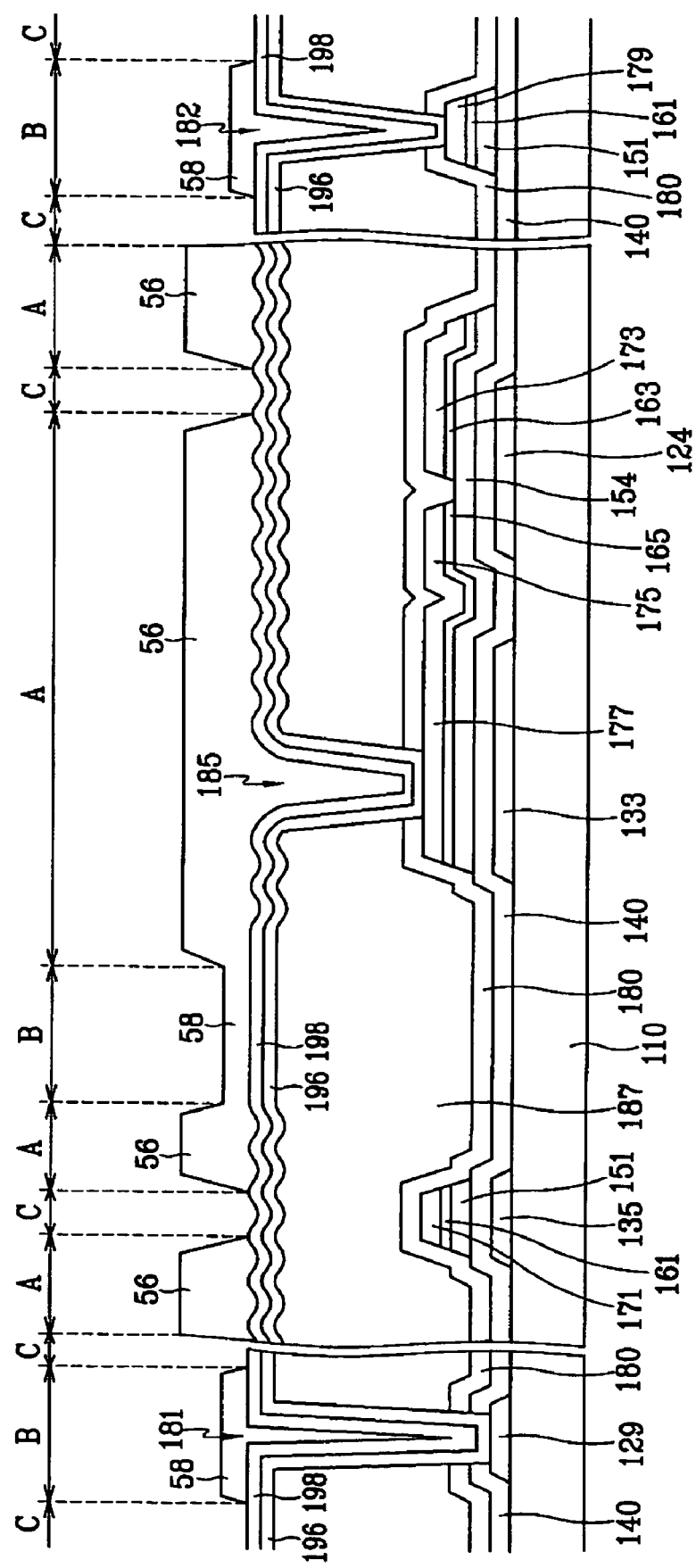
Figure 17:
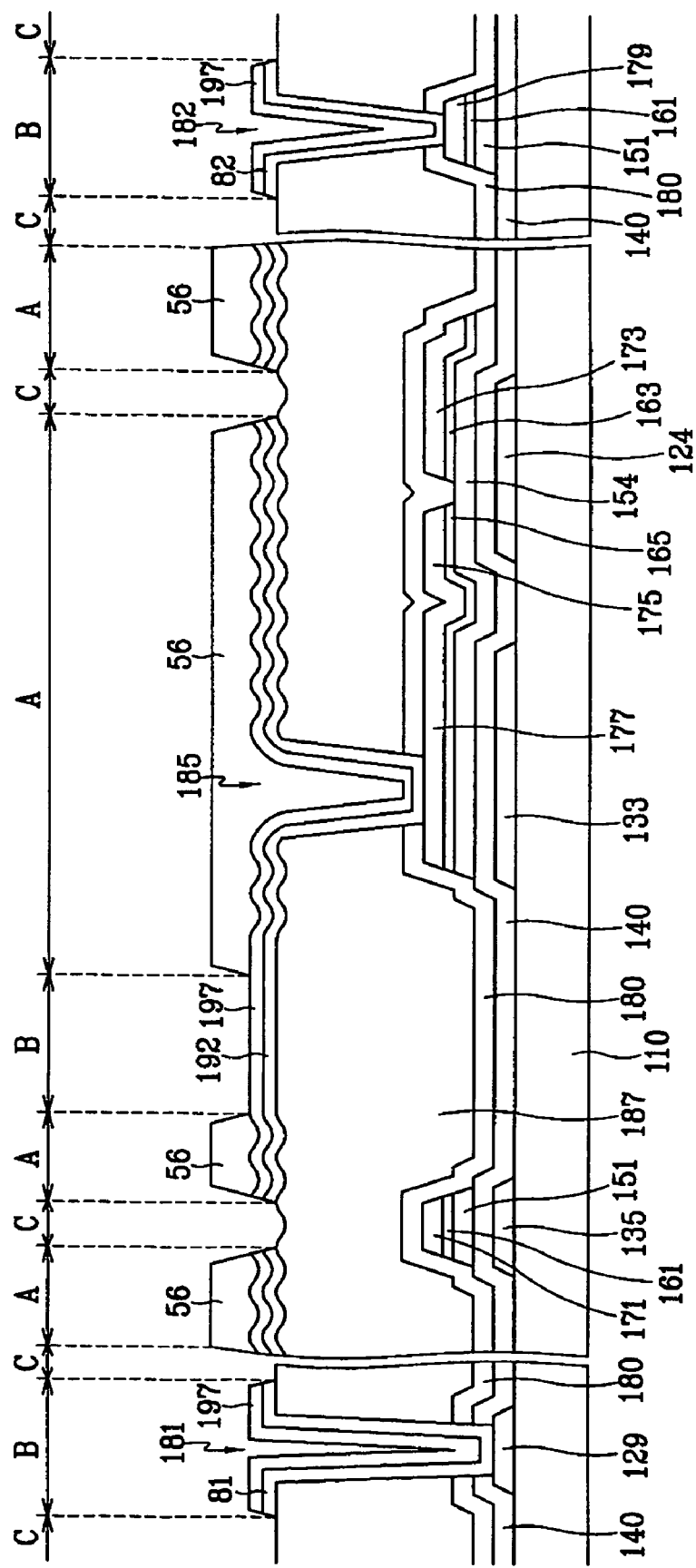

FIGS. 15 to 17 are sectional views sequentially illustrating the intermediate steps of a method of manufacturing a TFT array panel next to FIG. 8 according to another embodiment of the present invention.

Several manufacturing processes of the TFT array panel according to the present embodiment are the same as the processes of FIGS. 3 to 8.

A conductive layer is deposited on an insulating substrate 110 by a deposition method such as sputtering and the conductive layer is photo-etched by using a mask to form gate lines 121 and storage electrode lines 131.

Next, a gate insulating layer 140, an intrinsic amorphous silicon layer 150, an extrinsic amorphous silicon layer 160, and a conductive layer 170 are sequentially deposited.

Then, the conductive layer 170 is photo-etched by using a photoresist layer and a photo mask to form data lines 171, drain electrodes 175, and ohmic contacts 163 and 165.

Next, a passivation layer 180 is deposited and an organic insulating layer 187 is coated on the passivation layer 180.

Referring to FIG. 15, the organic insulating layer 187 is exposed to light through a photo mask having a predetermined pattern such as slits and is developed to form an embossed structure on the reflection region RA of the surface of the organic insulating layer 187 and contact holes 181, 182, and 185.

Referring to FIG. 16, an ITO layer 196 and a conductive layer 198 are sequentially deposited by a deposition method such as sputtering. A photoresist layer is coated on the conductive layer 198 and a photo mask (not illustrated) is aligned on the photoresist layer. The photo mask has translucent regions B as well as transparent regions C and light blocking opaque regions A.

The photoresist layer is exposed to light through the photo mask and developed such that the developed photoresist has a position-dependent thickness as shown in FIG. 16. The developed photoresist includes a plurality of fifth and sixth portions 56 and 58. The third portions 56 are disposed under the light blocking opaque regions A and the fourth portions 58 are disposed under the translucent regions B. No photoresist remains under the transmission region C. That is, the photoresist pattern has different thicknesses between the transmission region TA and the reflection region RA.

Next, the conductive layer 198 is wet-etched with an Al etchant by using the photoresist 56 and 58 as an etch blocker. Then, the ITO layer 196 is wet-etched with an IZO etchant by using the photoresist 56 and 58 and the etched conductive layer 197 as an etch blocker.

The photoresist portions 56 and 58 are etched to remove the sixth portions 58, thereby forming the portions of the conductive layer 197 disposed on the transmission regions TA and pad regions. The etching of the photoresist portions 56, 58 reduce the thickness of the third portions 56.

Next, exposed portions of the conductive layer 197 are wet etched with an Al etchant to expose transmission electrodes 192 and contact assistants 81 and 82. Thereby, the transmission region TA and pad portions are completed.

Since edges of the conductive layers 197 are also exposed, the edges of the conductive layers 197 are etched together by the Al etchant. The etched edges of the conductive layers 197 are recessed. The recessed width (t) is substantially uniform in four sides of the conductive layers 197 and is substantially the same as or larger than the thickness of the conductive layers 197.

Next, residual photoresist is removed to expose the reflection electrodes 194 on the reflection region RA.

In the embodiments, embossed surfaces of the organic insulating layer 187 is only formed on the reflection region RA. However, this is not a limitation of the invention and embossed surfaces may also be formed on the transmission region TA. In the embodiments, the heights of the transmission region TA and the reflection region RA are the same. However, the height of the transmission region TA may be lower than that of the reflection region RA by removal of the passivation layer 180 and/or the organic insulating layer 187. In the embodiments, the contact assistants 81 and 82 are formed on the same layer as the transmission electrode 192. However, the contact assistants 81 and 82 may be formed along with the reflection electrode 194.

According to the present invention, the gate line layer, the semiconductor layer, the data line layer, the passivation layer, the organic insulating layer, and the pixel electrode layer are respectively patterned by using a single mask. Accordingly, a TFT array panel is manufactured by four masks. Thus, the manufacturing cost and time are reduced.

Although preferred embodiments of the present invention have been described in detail hereinabove, it should be clearly understood that many variations and/or modifications of the basic inventive concepts herein taught, which may appear to those skilled in the present art, will still fall within the spirit and scope of the present invention, as defined in the appended claims.

What is claimed is:

1. A method of manufacturing a TFT array panel comprising:
    forming a plurality of thin film transistors each having a gate electrode, a source electrode, and a drain electrode;
    forming an insulating layer on the thin film transistors;
    forming a first conductive layer electrically connected to the drain electrodes on the insulating layer;
    forming a second conductive layer on the first conductive layer;
    forming a photoresist layer including first portions and second portions thinner than the first portions;
    selectively etching the second conductive layer with a first etchant by using the photoresist layer as an etch blocker; and
    selectively etching the first conductive layer with a second etchant by using the photoresist layer and the second conductive layer as etch blockers.

2. The method of claim 1, further comprising:
    etching the photoresist layer to remove the second portions and to expose the second conductive layer after the selective etching of the first conductive layer; and
    selectively etching the exposed portions of the second conductive layer with the first etchant by using the first portions of the photoresist layer as an etch blocker.

3. The method of claim 1, wherein the first conductive layer contains ITO.

4. The method of claim 3, wherein the ITO has an amorphous state.

5. The method of claim 4, wherein the second etchant contains sulfuric acid.

6. The method of claim 4, wherein the second etchant contains hydrochloric acid and a surfactant.

7. The method of claim 4, wherein the second etchant contains oxalic acid and a surfactant.

8. The method of claim 3, wherein the second conductive layer contains Al or an Al alloy.

9. The method of claim 8, wherein the first etchant contains phosphoric acid, nitric acid, and acetic acid.

10. The method of claim 1, wherein the formation of the first conductive layer is performed at a temperature between 25° C. and 150° C.

11. The method of claim 10, wherein the formation of the first conductive layer is performed in an atmosphere of hydrogen gas ($H_2$) or water vapor ($H_2O$).

12. A method of manufacturing a TFT array panel comprising:
    forming a gate line;
    forming a semiconductor, a data line and a drain electrode on the gate line;
    forming a passivation layer and an organic insulating layer on the data line and the drain electrode;
    sequentially depositing an amorphous ITO layer and a first conductive layer on the organic insulating layer;
    forming a photoresist layer including first portions and second portions thinner than the first portions on the first conductive layer;
    selectively etching the first conductive layer with a first etchant by using the photoresist layer as an etch blocker; and
    selectively etching the amorphous ITO layer with a second etchant by using the photoresist layer and the first conductive layer as etch blockers;
    etching the photoresist layer to remove the second portions and to expose the first conductive layer; and
    selectively etching the exposed portions of the first conductive layer with the first etchant by using the first portions of the photoresist layer as an etch blocker.

13. The method of claim 12, wherein the formation of the amorphous ITO layer is performed at a temperature between 25° C. and 150° C.

14. The method of claim 13, wherein the formation of the amorphous ITO layer is performed in an atmosphere of hydrogen gas ($H_2$) or water vapor ($H_2O$).

15. The method of claim 13, wherein the second etchant contains sulfuric acid.

16. The method of claim 13, wherein the second etchant contains hydrochloric acid and a surfactant.

17. The method of claim 13, wherein the second etchant contains oxalic acid and a surfactant.

18. The method of claim 13, wherein the first conductive layer contains Al or an Al alloy.

19. The method of claim 18, wherein the first etchant contains phosphoric acid, nitric acid, and acetic acid.

* * * * *